(12) United States Patent
Barrenscheen et al.

(10) Patent No.: US 9,188,645 B2
(45) Date of Patent: *Nov. 17, 2015

(54) SYSTEM AND METHOD FOR TESTING A CIRCUIT

(71) Applicant: Infineon Technologies AG, Neubiberg (DE)

(72) Inventors: Jens Barrenscheen, Munich (DE); Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 392 days.

This patent is subject to a terminal disclaimer.

(21) Appl. No.: 13/721,977

(22) Filed: Dec. 20, 2012

(65) Prior Publication Data

US 2014/0009162 A1    Jan. 9, 2014

Related U.S. Application Data

(63) Continuation of application No. 12/696,932, filed on Jan. 29, 2010, now Pat. No. 8,339,139.

(51) Int. Cl.
*G01R 31/327* (2006.01)
*G01R 31/02* (2006.01)
*G01R 31/00* (2006.01)

(52) U.S. Cl.
CPC .............. *G01R 31/327* (2013.01); *G01R 31/00* (2013.01); *G01R 31/3272* (2013.01); *G01R 31/007* (2013.01)

(58) Field of Classification Search
CPC .... G01R 31/00; G01R 31/007; G01R 31/327; G01R 31/3272
USPC ...................... 324/415–424, 76.11, 537, 555; 702/108, 118, 120, 121
See application file for complete search history.

(56) References Cited

U.S. PATENT DOCUMENTS

| | | | |
|---|---|---|---|
| 4,320,508 A | 3/1982 | Takezoe | |
| 6,204,770 B1 | 3/2001 | Johnson | |
| 7,554,335 B2 | 6/2009 | Han et al. | |
| 8,339,139 B2* | 12/2012 | Barrenscheen et al. | ...... 324/418 |
| 8,660,489 B2* | 2/2014 | Barrenscheen et al. | ..... 455/41.2 |
| 2005/0201658 A1* | 9/2005 | Yakymyshyn et al. | ......... 385/12 |
| 2006/0014503 A1* | 1/2006 | Theobold et al. | ............. 455/126 |
| 2007/0250285 A1 | 10/2007 | Thoman | |

* cited by examiner

*Primary Examiner* — Hoai-an D Nguyen
(74) *Attorney, Agent, or Firm* — Infineon Technologies AG

(57) ABSTRACT

In an embodiment, a device comprises a circuit with at least one circuit element; measurement circuitry capable to test a state of the at least one circuit element during an operation of the circuit, the measurement circuitry comprising a first terminal configured to be coupled to a first node of the circuit via a first capacitor, a second terminal configured to be coupled to a second node of the circuit, wherein the measurement circuitry is configured to determine in situ an operating state of the at least one circuit element based on signals applied by the measurement circuitry to the circuit during the operation of the circuit.

9 Claims, 9 Drawing Sheets

SYSTEM AND METHOD FOR TESTING A CIRCUIT

RELATED APPLICATIONS

This application is a continuation of U.S. patent application Ser. No. 12/696,932 entitled "System and Method for Testing a Circuit" which was filed on Jan. 29, 2012 and claims the benefit of the priority date of the above U.S. Application, the contents of which are herein incorporated by reference.

TECHNICAL FIELD

This invention relates generally to electrical components, and more particularly to a system and method testing a circuit.

BACKGROUND

In many electronic applications, switches are used to control current flow in a system. In high voltage systems, such as lighting systems and electric machines, a multitude of switches can be used to enable and disable high voltage and high current paths during system operation. In safety-critical applications, such as elevators, and electric automobiles, and public transportation vehicles, however, the state of switching components is tested and diagnosed in order to detect and remedy different types of system failures. For example, if a failed switch is detected when an electric car is being turned on, a controller on board the electric car can prevent the car from starting, well as log a message in the car's memory noting the switch failure so that the car's manufacturer or mechanic can later be apprised of the source of the failure.

In systems where switches are connected in series, for example, in high-voltage systems, galvanic isolated circuitry is used to determine the state of each single switch because the connecting points of the switches can be at any potential in the system. Furthermore, isolated diagnostic capability is used in cases where the power components and the control components are not referring to the same ground potential, or are even isolated, such as the case in electric vehicles where the ground used to reference the electric motor and other high voltage machinery is isolated from the ground used to reference control circuitry and low power microelectronics.

In the case of high currents and/or voltages, mechanical switches, such as relays, are used because their conduction losses are smaller than the conduction losses of semiconductor switches. To detect a switching state for a relay, knowledge of whether the power contacts are open or closed is used. For example, in conventional isolated switch sensing devices, such as a force-guided contact relay, power contacts are mechanically coupled to a sensing contact that is opened and closed in parallel to the power contact. In some cases, however, this mechanical coupling increases the size and the complexity for manufacturing of a relay, especially if the relay is hermetically sealed for arc suppression.

In some systems, fuses are also used to control current flow. In the event of an overload condition, a fuse is blown, which creates an open circuit, thereby preventing further current flow. An overload condition in the system can occur due to abnormal functioning of some components, or can occur due to other reasons, such as heavy external loading. If a system is operated without regard to the state of a fuse, additional damage can be done to the system. What is needed are systems and methods for fuse and switch state diagnostics.

SUMMARY OF THE INVENTION

In an embodiment, a device comprises a circuit with at least one circuit element; measurement circuitry capable to test a state of the at least one circuit element during an operation of the circuit, the measurement circuitry comprising a first terminal configured to be coupled to a first node of the circuit via a first capacitor, a second terminal configured to be coupled to a second node of the circuit, wherein the measurement circuitry is configured to determine in situ an operating state of the at least one circuit element based on signals applied by the measurement circuitry to the circuit during the operation of the circuit:

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely systems and methods for testing switching devices in a circuit. Embodiments of this invention may also be applied to systems and methods directed toward other forms of circuit testing.

Figure 1A:
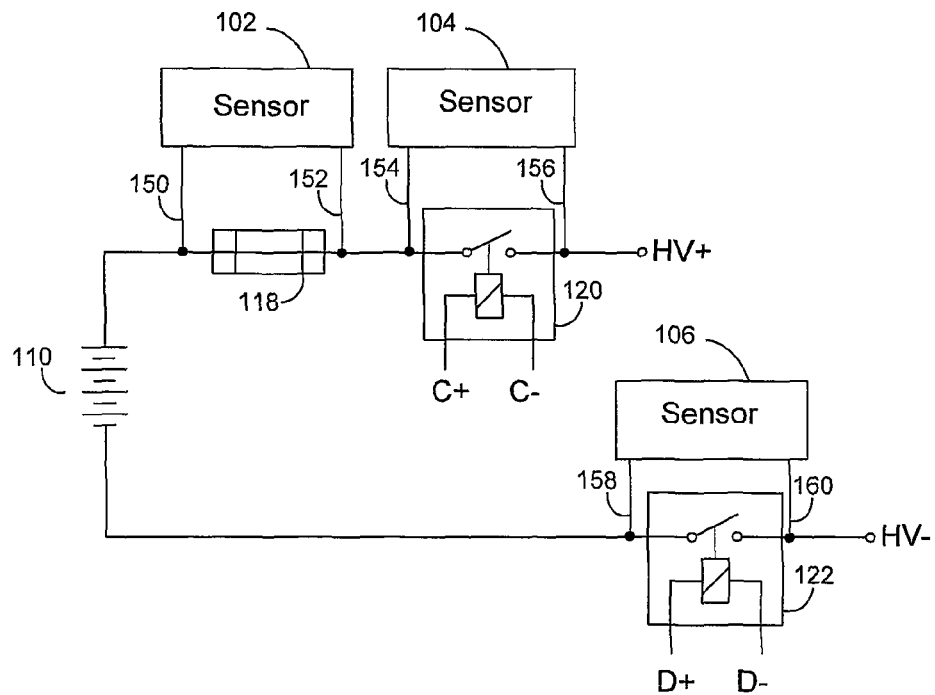
FIGS. 1a-1b illustrate embodiment battery switch systems.

FIG. 1a illustrates an example embodiment of the present invention directed toward a battery system that has high voltage battery 110 in series with fuse 118 and switches 120 and 122. Switches 120 and 122 controlled by terminal pairs C+, C− and D+, D−, respectively, connect and disconnect connecting terminals HV+ and HV− from battery 110. In some embodiments, switches 120 and 122 isolate battery 110 from terminals HV+ and HV− when a connected load (not shown) is shut down or disabled. In some embodiments, the load is shut down or disabled, for example, when the system is undergoing maintenance. Fuse 118 breaks the current conduction path of battery 110 in the case of a current overload condition. Sensor 102 monitors the state of fuse 118 via terminals 150 and 152, sensor 104 monitors the state of switch 120 via terminals 154 and 156, and sensor 106 monitors the state of sensor switch 122 via terminals 158 and 160. In some embodiments, switches 120 and 122 are implemented by single pole relays. Alternatively, other switch types such can be used.

Figure 1B:
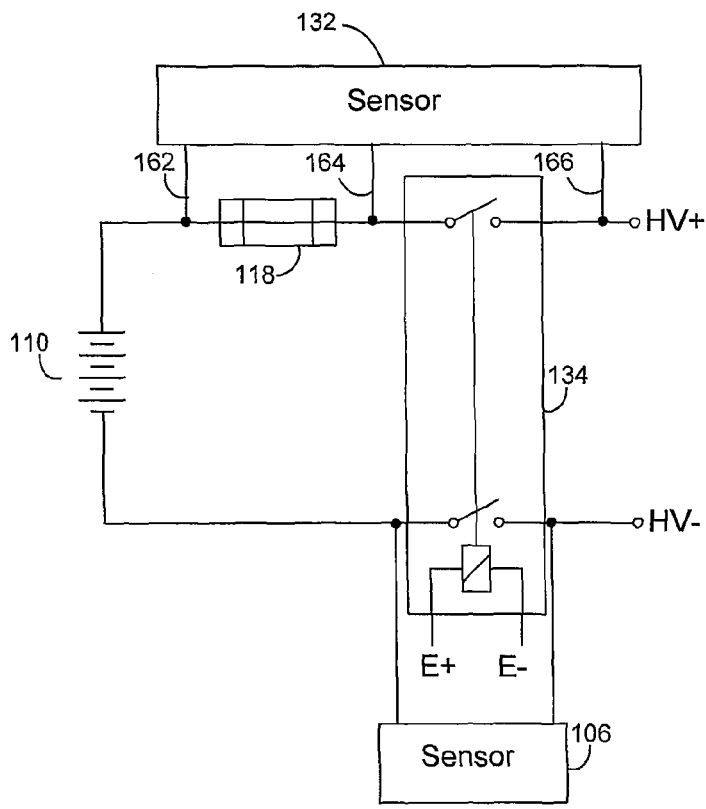

FIG. 1b illustrates embodiment battery system that connects battery 110 to terminals HV+ and HV− via double pole switch 134 controlled by terminal pair E+, E−. Embodiment sensor 106 detects the state of the portion of switch 134 that connects battery 110 to HV− via terminals 158 and 160. Embodiment sensor 132 detects the state of fuse 188 via terminals 162 and 154, and detects the state of the portion of switch 134 that connects battery 110 to terminal HV+ via terminals 164 and 166. In some embodiments, for example, where battery terminal connections HV+ and HV− are in close proximity, double pole switch 134 can be used. In other embodiments where terminal connections HV+ and HV− are not in close proximity, independent switches 120 and 122 (FIG. 1a) can be used.

In an embodiment of the present invention, a value of at least one capacitance is modulated by the switch is sensed. If the switch is closed, for example, the resulting capacitance seen at the input of the switch is larger than the capacitance seen when the switch is open. In embodiments, the changed capacitance is sensed by measuring an AC response though the switch.

Figure 2A:
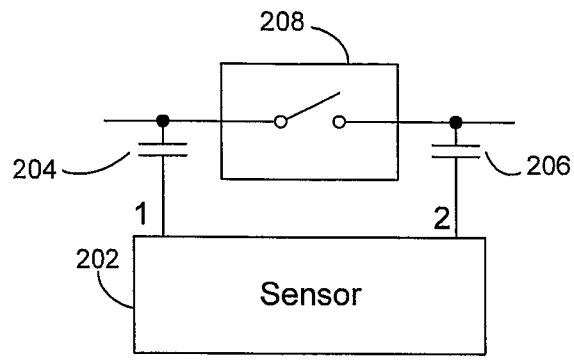
FIGS. 2a-2c illustrate embodiment topologies for switch state determination.
Figure 2B:
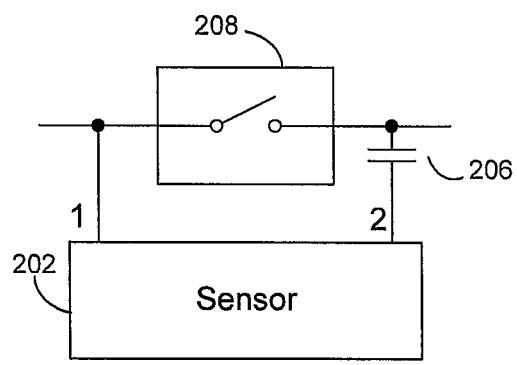
Figure 2C:
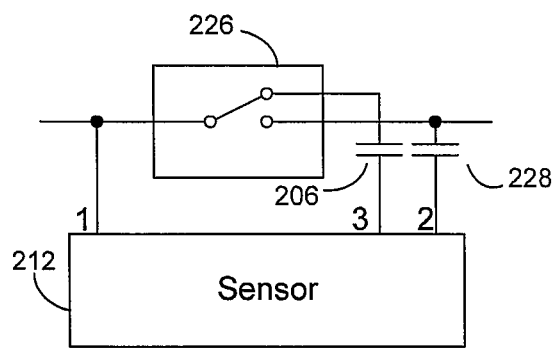

FIGS. 2a-c illustrate several embodiment topologies for switch state determination based on capacitive sensing. In FIG. 2a, switch 208 is monitored by sensor 202 via isolating capacitors 204 and 206. Switch 208 represents any kind of switch, such as a simple mechanical switch, a relay, fuse, etc. Alternatively, switch 208 can be a junction (e.g. pn junction) of a transistor or a FET channel, or any other component modulating a capacitance. In an embodiment, sensor 202 produces an AC test signal at terminal 1 and receives the AC test signal at terminal 2. If the magnitude of the received test signal is greater than a predetermined threshold, switch 208 is determined to be closed. If, on the hand, the magnitude is less than a predetermined threshold, switch 208 is determined to be open. In an embodiment of the present invention, the AC signal is transmitted at an amplitude of about a few volts, with a frequency range of several hundred kHz to several MHz. Alternatively, other amplitudes and frequencies can be used. In an embodiment, an absolute portion of a detected transmission factor from terminal 1 to terminal 2 is compared against a threshold that is defined by sensor 202. In an embodiment, the threshold is predefined according to typical a application set stored in non-volatile memory locations (Flash, EEPROM, on-chip fuses, etc.) after a teach-in phase, or configured by external components (e.g. external R).

FIG. 2b illustrates an embodiment of the present invention where switch 208 is monitored by sensor 202. Sensor 202 is coupled to switch 208 via capacitor 206 at terminal 2, and via a direct connection to switch 208 at terminal 1. In embodiments where isolation between the sensor and the monitored device is not necessary, for example, where the sensor itself has an independent power supply and communication between the sensor and the system control unit is already isolated, a direct connection can be made to sensor 202.

FIG. 2c illustrates an embodiment switch state sensor topology directed toward a single pole double throw (SPDT) switch 226. Sensor 212 is coupled to a common node of switch 226 via terminal 1. Sensor terminals 3 and 2 are coupled to the remaining nodes of the switch via capacitors 206 and 228 respectively. In an embodiment, an AC signal is transmitted from terminal 1 and received by terminals 3 and 2. If the magnitude of the received signal at terminal 2 is greater than the magnitude of the received signal at node 3, then the switch is determined to be in a first state. If, on the other hand, the magnitude of the received signal at terminal 3 is greater than the magnitude of the received signal at node 2, the switch is determined to be in the other state. Alternatively, the magnitudes of the received signals received at nodes 3 and 2 can each be compared to a predetermined threshold to determine independently whether either of the coupling paths are at a high impedance state or a low impedance state, for example in cases where a multiplexer is monitored. FIG. 2c illustrates terminal 1 being directly coupled to switch 226. In alternative embodiments, terminal 1 can be coupled to switch 226 via a capacitor.

Figure 3A:
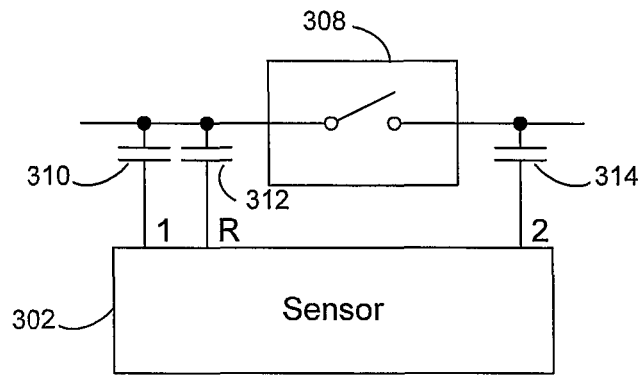
FIGS. 3a-3c illustrate further embodiment topologies for switch state determination.
Figure 3B:
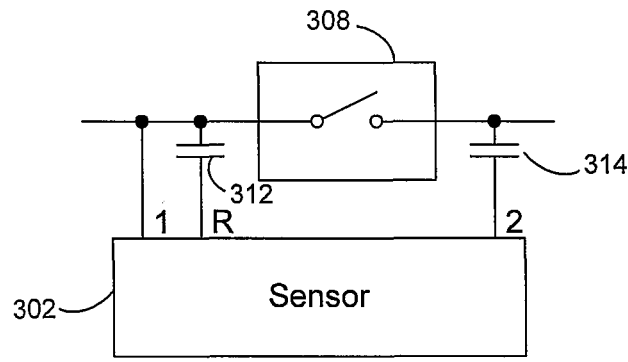

FIGS. 3a-3b illustrate several embodiment topologies for switch state determination based on capacitive sensing using an additional sensor reference terminal. FIG. 3a illustrates sensor 302 coupled to switch 308. Like the embodiments depicted in FIG. 2a, terminals 1 and 2 of sensor 302 are coupled to each node of switch 308 via capacitors 310 and 314. In addition, sensor 302 has reference terminal R coupled to the left side of switch 308 (same side as terminal 1). During operation, sensor 302 determines a first transmission factor between terminal 1 and terminal 2, and a second transmission factor between terminal 1 and terminal R. A transmission factor describes the relation between the transmitted signal to the received signal and comprises information about attenuation (magnitude) and phase. If the ratio of the first transmission factor to the second transmission factor is greater than a predetermined threshold, switch 308 is determined to be closed. If, on the other hand, the ratio of the first transmission factor to the second transmission factor is less than a predetermined threshold, switch 308 is determined to be open. In an embodiment, reference terminal R and capacitor 312 is used to compensate for drift effects of the circuit. Because a ratio of AC responses is used in determining the state of switch 308, the measurement threshold is not as sensitive to the absolute values of the circuit elements, such as capacitors 310, 312 and 314 or internal references. Measuring the ratio of AC responses also compensates for that drift effects in the sensing components and/or references, for example, due to aging, temperature, and supply voltage.

In some embodiments, drift effects are compensated when drift effects are different for sensing elements and references. In a further embodiment, portions of the first transmission factor is compared against portions of the second transmission factor. When the portions show similar drift behavior, less effort is required for compensation.

In embodiments of the present invention, the transmission factor can be measured in terms of voltage gain, current gain, transconductance or transresistance. For example, in an embodiment measuring the transresistance, the transmitter transmits an AC current and the receiver measures a received voltage. Alternatively, the capacitance between nodes can be measured using techniques described herein, as well as techniques known in the art.

In an embodiment, capacitors 310, 312 and 314 are sized such that the total capacitance of capacitors 310 and 312 between terminals 1 and R is larger than the total capacitance of capacitors 310 and 314 between terminals 1 and 2 if the switch 308 is open, but is smaller if switch 308 is closed. Alternatively, other ratios and relationships between capacitors can be used. FIG. 3b, illustrates an embodiment in which terminal 1 is directly coupled to switch 308.

Figure 3C:
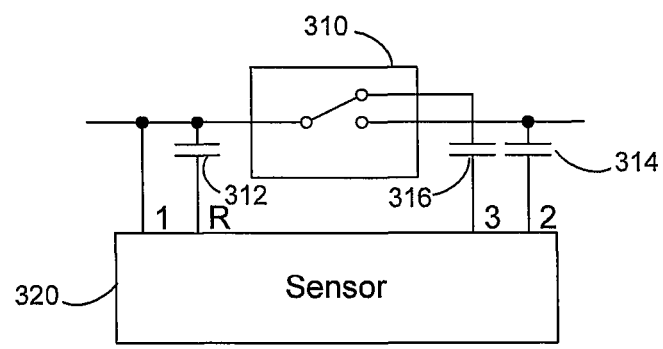

FIG. 3c illustrates an embodiment of the present invention where the state of a SPDT switch or multiplexer is determined SPDT switch 310 is coupled to sensor 320 via capacitor 312 at terminal R, capacitor 314 at terminal 2, and capacitor 316 at terminal 3. Terminal 1 is shown with a direct connection to switch 310, however, in alternative embodiments, terminal 1 can be coupled to switch 310 via a capacitor. During operation, a first AC magnitude response $A_{12}$ is measured between terminal 1 and terminal 2, a reference AC magnitude response $A_{1R}$ is measured between terminals 1 and R, and a second AC magnitude response $A_{13}$ is measured between terminals 1 and 3. Switch 310 is determined to be in a first state if $A_{12}/A_{1R}$ is greater than $A_{13}/A_{1R}$. Likewise, switch 310 is determined to be in a second state if the ratio $A_{12}/A_{1R}$ is less than $A_{13}/A_{1R}$.

Figure 4A:
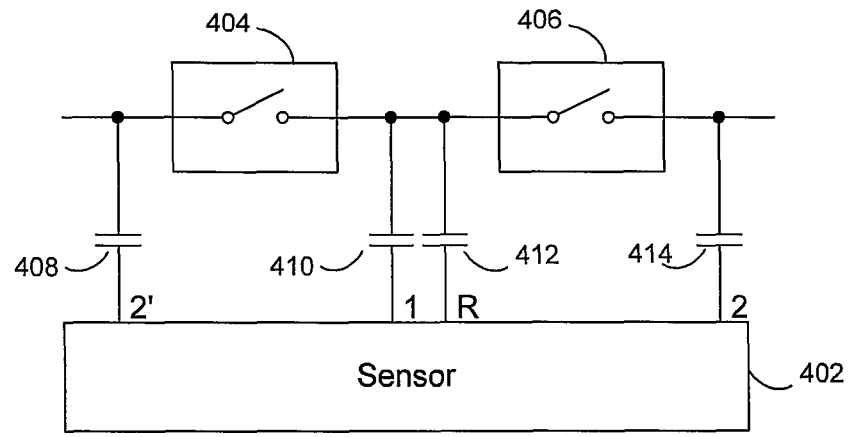
FIGS. 4a-4b illustrate embodiment switch sensors that determine the state of series connected switches.
Figure 4B:
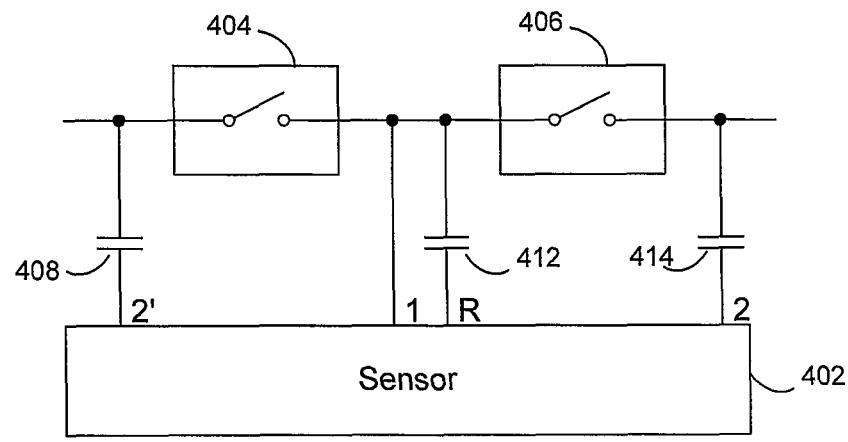

FIGS. 4a and 4b illustrate embodiment switch sensors that determine the state of series connected switches. FIG. 4a illustrates embodiment sensor 402 coupled to switches 404 and 406. Switch 406 is coupled to sensor 402 via capacitors 410, 412 and 414 to terminals 1, R and 2, respectively. Switch 404 is coupled to sensor 402 via capacitors 410, 412 and 408 to terminals 1, R and 2', respectively. Terminals 1 and R are coupled to a common point between switches 404 and 406. During operation, transmission factor $A_{12}$ is measured between terminal 1 and terminal 2, a transmission factor $A_{1R}$ is measured between terminals 1 and R, and transmission factor $A_{12'}$, is measured between terminals 1 and 2'. Switch 406 is determined to be opened if $A_{12}/A_{1R}$ exceeds a threshold and closed if $A_{12}/A_{1R}$ does not exceed the threshold. Likewise, switch 404 is determined to open if $A_{12'}/A_{1R}$ exceeds a threshold and closed if $A_{12'}/A_{1R}$ does not exceed the threshold. In embodiments, measurements for $A_{12}$, $A_{12'}$, and $A_{1R}$ are performed in parallel using separate sensing circuits, serially using a single sensing circuit, or a combination of both. In alternative embodiments of the present invention sensor 402 can be expanded to measure the more than two switches sharing a common node coupled to terminals 1 and R. FIG. 4b illustrates an embodiment switch sensor for series connected switches in which terminal 1 is directly coupled to a common point between switch 404 and 406.

Figure 5:
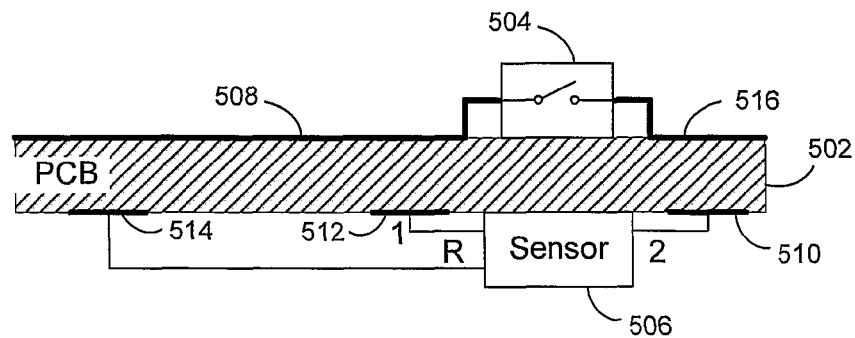
FIG. 5 illustrates an embodiment switch sensor for a printed circuit board (PCB)

FIG. 5 illustrates an embodiment in which the state of a switch 504 mounted on printed circuit board (PCB) 502 is measured by sensor 506. Terminals 1, 2 and R are coupled to switch 504 via the capacitance of PCB 502. For example, electrode 512 and 514 coupled to terminals 1 and R, respectively, are disposed on one side of the PCB opposite trace 508 coupled to one end of switch 504. Likewise, electrode 510 coupled to terminal 2 is also disposed on one side of the PCB opposite trace 516 coupled to the other end of switch 504. The sensor operates as described above with respect to the embodiment of FIG. 3a.

In an embodiment, electrical isolation between switch 504 and sensor 506 is achieved by placing the components on a PCB (printed circuit board). If a minimum distance is kept between high-voltage parts and the sensor, isolation is ensured. The minimum distance depends on the isolation capability of the material and the maximum voltage that should be blocked. Coupling elements are made by geometric overlap of high-voltage parts (shown here on the top side of the PCB) and the sensing elements (on the bottom side). The PCB itself ensures the galvanic isolation in some embodiments.

Due to small coupling effects between the overlapping areas on the top and on the bottom side of the PCB, and the resulting small capacitance, embodiment structures that use reference terminal R are advantageous because the ratio between two transmission factors are taken into account, which compensates for drift effects. Furthermore, the very small coupling reduces the induced voltages in the sensor in the case of switching under load conditions or if a fuse is blown. In some embodiments, because of the small coupling, standard electro static discharge (ESD) protection elements of the sensor chip, such as those found on standard, inexpensive, low voltage semiconductor processes, are strong enough to withstand a severe ESD event in the switch to be measured. Therefore, in some embodiments, no additional ESD protection means are necessary in the sensor chip. In alternative embodiments, where the coupling is greater and/or the ESD events are more severe, additional ESD protection may be required.

In an embodiment of the present invention, determination of switch states is based on the measurement of shift currents between dielectrically isolated electrodes of the sensor arrangement and conducting portions of a switch being monitored. Electrodes are stimulated by an AC signal and shift currents are injected into connections on each side of a fuse, switch or relay. Shift currents can take several return paths back to a stimulating source. These return paths are influenced by the switch position or fuse state. A closed switch state introduces a low impedance conducting path between the contacts of the monitored device, while an open switch offers a high impedance and/or electrical isolation, therefore, an expected change in the return paths of the shift currents is detectable. Here, the transmission factor of the paths differ and the differences can be used to detect the state of a switch. In some embodiments, a shift in return paths is measured in the stimulation path that is connected to an injection electrode, which is an electrode connected to an AC signal source, or is detected using an additional receiver coupled to a point on the other side of the switch. In an embodiment, the coupling of the receiver to the circuit is realized by a direct galvanical contact or capacitively by a second electrode. Depending on the amplitude of the shift current, a determination is made of whether the switch is opened or closed.

Figure 6:
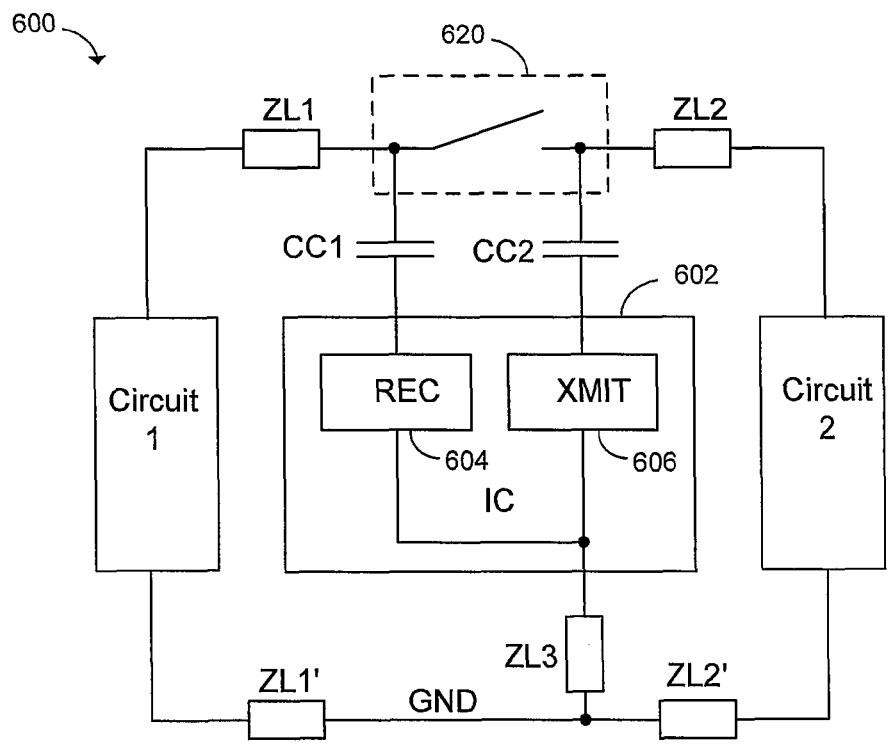
FIG. 6 illustrates an embodiment switch measuring system.

FIG. 6 illustrates embodiment measurement system 600. Sensor IC 602 has receiver 604 coupled to a first side of switch 620 via capacitor CC1, and transmitter 606 coupled to a second side of switch 620 via capacitor CC2. Switch 620 couples Circuit 1 to Circuit 2. In some embodiments, Circuit 1 can be a power supply and Circuit 2 can be a load. Impedance ZL1 represents the impedance between Circuit 1 and switch 620, impedance ZL2 represents the impedance between switch 620 and circuit 2. Impedances ZL1', ZL2' and ZL3 represent the ground impedances from Circuit 1, Circuit 2 and IC 602 to GND, respectively.

According to FIG. 6, there are three return paths for a current generated at transmitter:
1. CC2→Switch 620→CC1→Receiver 604;
2. CC2→Switch 620→ZL1→Circuit 1→ZL1'→ZL3; and
3. CC2→ZL2→Circuit 2→ZL2'→ZL3.

When switch 620 is closed and the impedance of path 1 is low compared to path 2 and path 3 in parallel, it is assumed that a detectable current can be measured at receiver 604. This condition is fulfilled if an AC signal is chosen appropriately with respect to frequency and amplitude. Further, the impedance of paths 2 and 3 can be adjusted by introduction of the impedance ZL3, if necessary. When switch 620 is open, current along path 1 is due to parasitic capacitive coupling between the disconnected parts of switch 620, thereby reducing the coupling between CC1 and CC2. In embodiments, the current in the parasitic return path when the switch is open is less than the current in path 1 when the switch is closed. Differences in measured currents can be directly related to the state of the switch and is usable for monitoring of the switch in some embodiments. In one embodiment, switch states are determined by comparing the measurement to a threshold. For example, if the measured current through path 1 is above the threshold, switch 620 is determined to be open. If, on the other hand the current through path 1 is below the threshold, switch 620 is determined to be open.

In one embodiment, the impedances of circuit1, circuit2 and the other ZLs are not considered (see FIG. 6). At least one side of the switch is decoupled by a capacitor because the voltage between the contacts of a switch can easily exceed the voltage capability of the sensor device, especially when opening the switch under inductive load conditions due to wiring.

Figure 7:
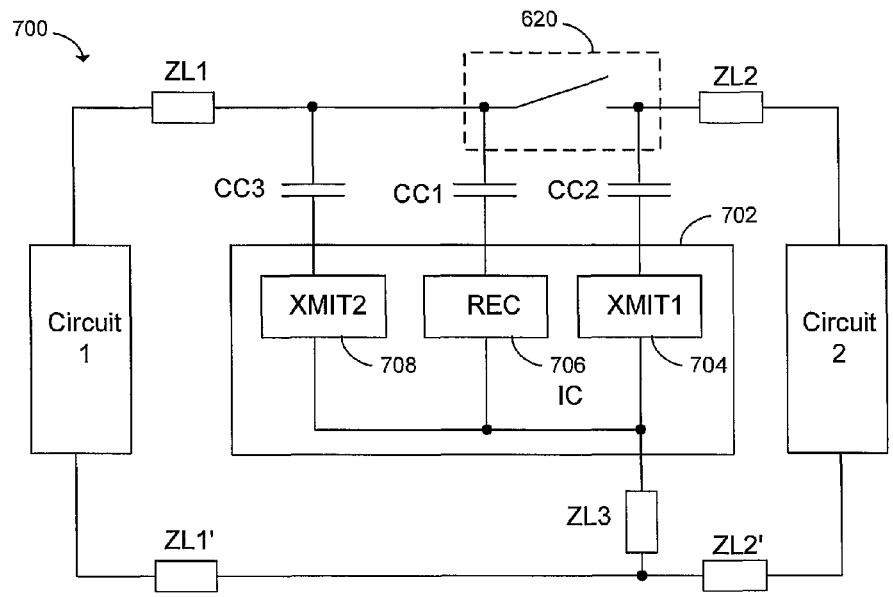
FIG. 7 illustrates an embodiment switch measuring system.

FIG. 7 illustrates embodiment measurement system 700. Sensor IC 702 has receiver 706 coupled to a first side of switch 620 via capacitor CC1, transmitter 708 coupled to the first side of switch 620 via capacitor CC3, and transmitter 704 coupled to a second side of switch 620 via capacitor CC2. Switch 620 couples Circuit 1 to Circuit 2. In some embodiments, Circuit 1 can be a power supply and Circuit 2 can be a load Impedance ZL1 represents the impedance between Circuit 1 and switch 620, impedance ZL2 represents the impedance between switch 620 and circuit 2. Impedances ZL1', ZL2' and ZL3 represent the ground impedances from Circuit 1, Circuit 2 and IC 702 to GND, respectively.

In the embodiment shown in FIG. 7, IC 702 determines the decision threshold using a reference measurement, thereby making the determination of the state of switch 620 independent of the fabrication spread of CC1 and CC2. In this case, CC3 is chosen to be smaller than CC2, which can be accomplished, for example, by scaling the electrode area in PCB implementations. This creates a condition where the current measured at receiver 706, during stimulation with the transmitter 704 when the switch is closed, is larger than the current measured during transmission with transmitter 708. In this case, the switch is determined to be closed if the current measured from transmitter 704 is higher than a corresponding measurement using transmitter 708. If this is not the case, switch 620 is determined to be open.

In an alternative embodiment, capacitances CC1, CC2 and CC3 are scaled by changing the distance between the coupling electrodes at both transmitters instead adjusting the area of the electrodes. In this case the distance between the switch current path and the electrode at transmitter 704 is lower than the distance of the electrode at transmitter 708. In a further embodiment, scaling is achieved by scaling the stimulus voltages output from transmitters 704 and 708 instead of adjusting the geometries of capacitors CC1, CC2 and CC3. Alternatively, a combination of geometric and voltage scaling methods can be used.

Figure 8:
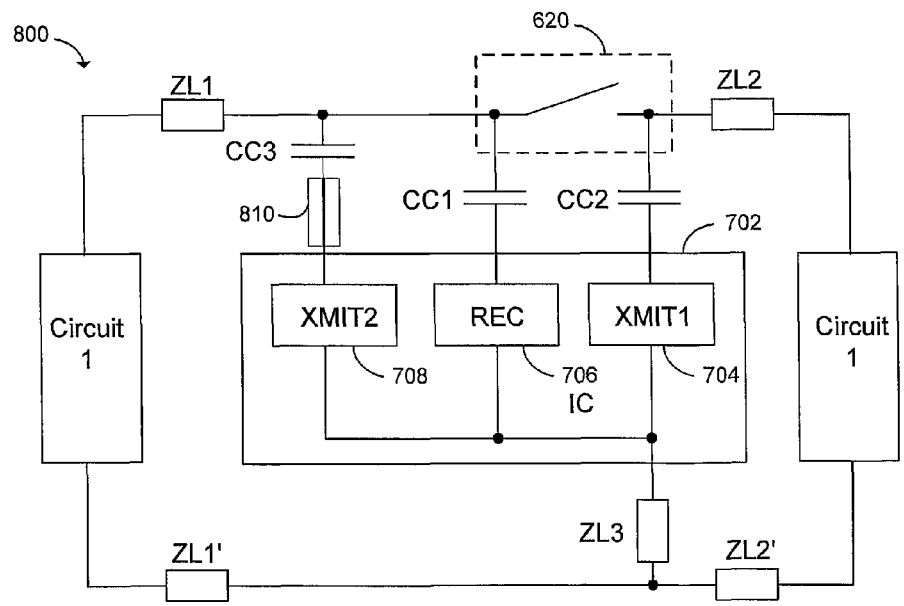
FIG. 8 illustrates another embodiment switch measuring system.

FIG. 8 illustrates embodiment measurement system 800, which is similar to embodiment 700 of FIG. 7 with the addition of closed dummy switch 810 coupled in series with capacitor CC3. The resistance of dummy switch 810 compensates for resistance in switch 620. For example, in embodiments where the switch resistance of switch 620 is non-negligible, the high switch resistance may effect the measured ratio of the transmitted current though CC2 and the transmitted current though CC3. In some embodiments, dummy switch 810 has similar impedance characteristics as switch 620, or is made from a same type of switch. In other embodiments, dummy resistor 810 can be implemented using a resistor. In further embodiments, dummy resistor 810 is greater than the maximum resistors of switch 620.

Figure 9:
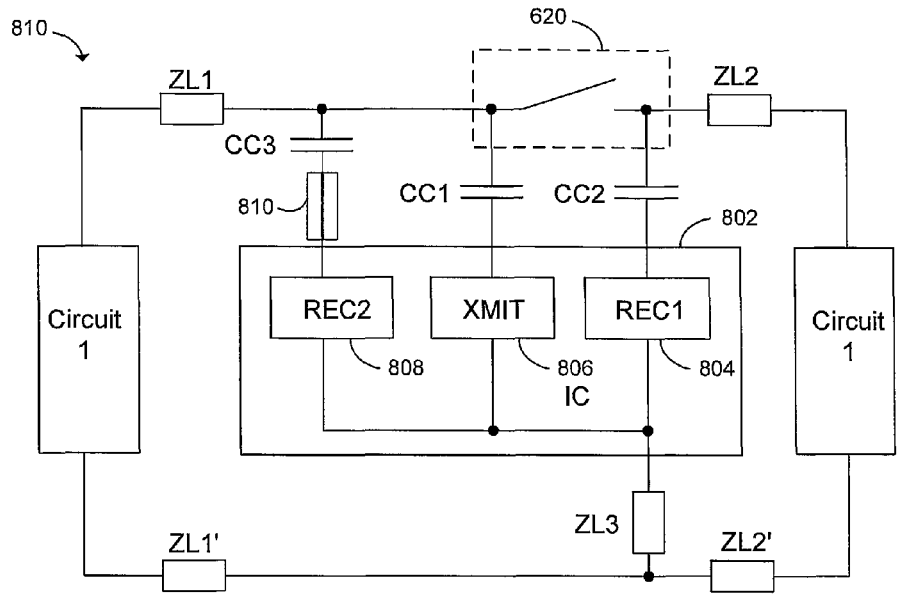
FIG. 9 illustrates a further embodiment switch measuring system.

FIG. 9 illustrates alternative embodiment measurement system 810, which is similar to embodiment 800 of FIG. 7, except that the transmit and receive directions have been swapped. Instead of having two transmitters and one receiver, IC 802 has a single transmitter 806 coupled to CC1, and two receivers 804 and 808 coupled to CC2 and CC3 respectively. By having two receivers, both measurements though CC2 and CC3 can be performed simultaneously, thereby reducing detection time in some embodiments.

Figure 10:
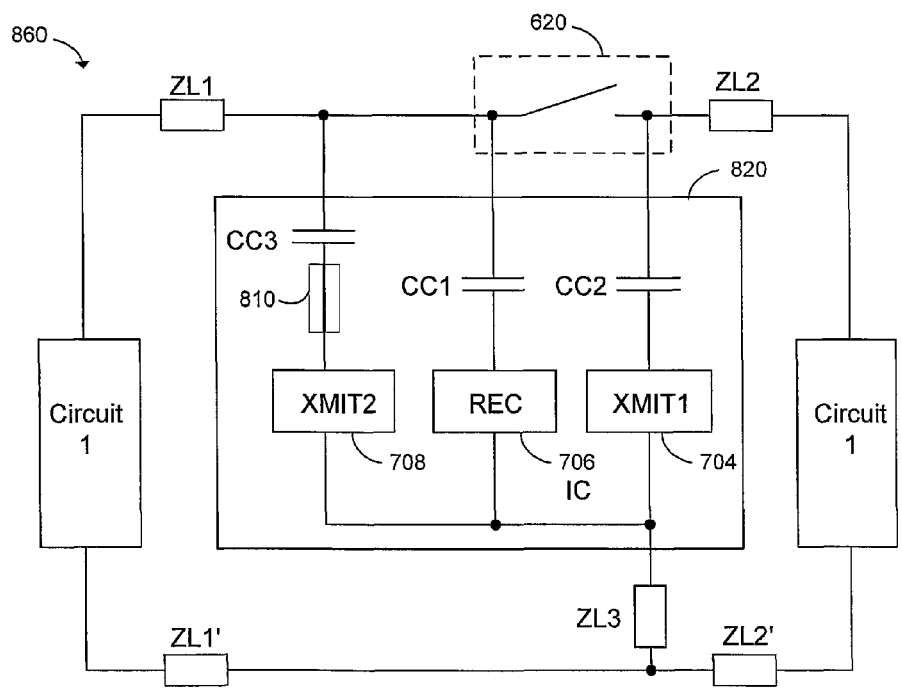
FIG. 10 illustrates a further embodiment switch measuring system.

FIG. 10 illustrates alternative embodiment measurement system 860, which is similar to embodiment 700 of FIG. 7, except that capacitors CC1, CC2, CC3, and dummy switch 810 are disposed on IC 820. In an alternative embodiment, dummy switch 810 is optional and can be omitted, especially in cases where the closed switched resistance of switch 620 is very small.

Figure 11:
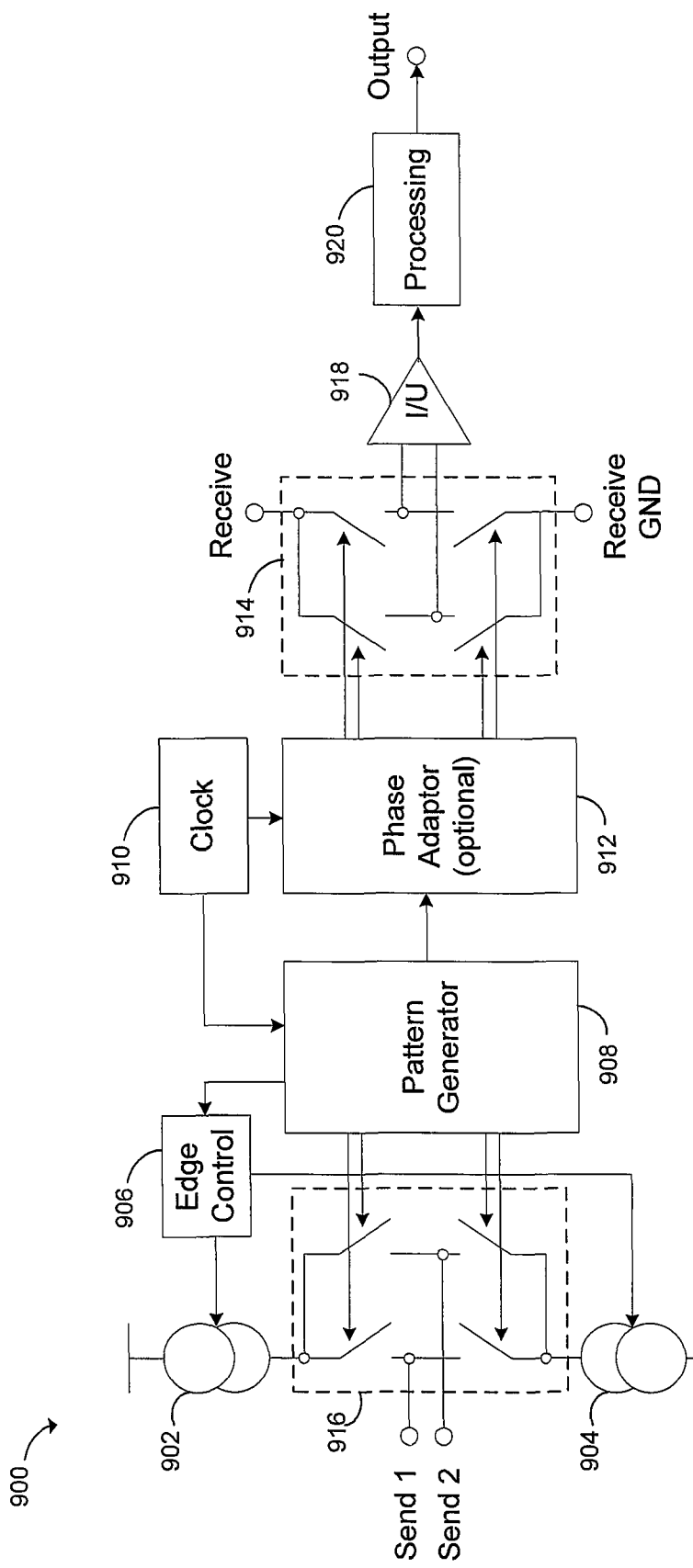
FIG. 11 illustrates an embodiment transceiver (transmitter and receiver)

FIG. 11 illustrates embodiment transceiver 900 that transmits signals Send 1 and Send 2, and receives signal Receive. The transmission path includes clock generator 910 coupled to pattern generator 908. Pattern generator 908 divides a clock signal provided by clock 910 and provides a pattern signal to edge control circuit 906, which provides slew rate control to current sources 902 and 904 in order to create a trapezoidal signal on signals Send 1 and Send 2. The receive path includes amplifier 918 followed by processor 920. Optional receive switch matrix 914 and phase adaptor 912 are used in an embodiment synchronous demodulation scheme.

In an embodiment trapezoid, signals have controlled rise and fall times. A multiplexed transmitter output can be achieved by switching a current source for charging or discharging the selected output via switch matrix 916. In an embodiment, the receiver uses a synchronous demodulation scheme based on a same pattern that is applied to control the transmit sequence. The phases of the pattern can be adapted to different delays that are caused by the different impedances of the different measurement paths in order to generate a demodulated signal with maximum signal energy. The demodulation itself is done by cross switching the incoming measurement current between the inverting and non inverting input of the following signal processing chain using switch matrix 914. In an embodiment, switch matrix 914 uses synchronous rectification. The demodulated current is converted into a voltage and subsequently amplified, filtered and A/D converted, in some embodiments. Alternatively, the A/D can be omitted and the switch determination made via analog processing. Finally a decision on the state of the monitored switch is taken and passed to the interface represented by signal Output.

Figure 12:
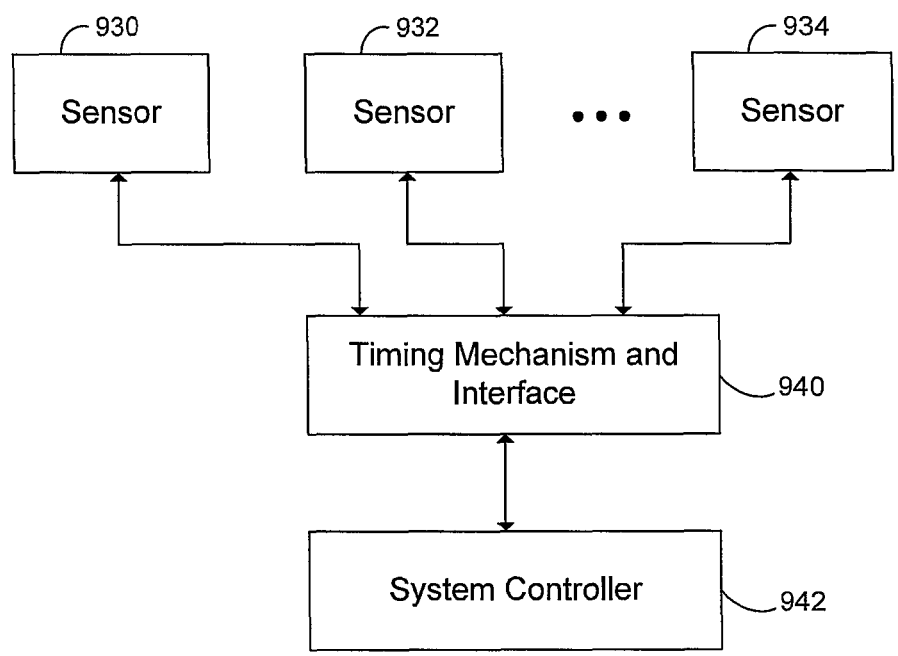
FIG. 12 illustrates an embodiment sensor system having multiple sensors.

FIG. 12 illustrates an embodiment system in which an arbitrary number of sensors 930, 932 and 934 are coupled to system controller 942 via timing mechanism and interface 940. Sensors 930, 932 and 934 are implemented according to embodiments described herein. To minimize power consumption and interference between sensors 930, 932 and 934, not all sensors are activated at the same time. Timing mechanism and interface 940, controlled by system controller 942, activates and receives the results from sensors 930, 932 and 934. In one embodiment, timing mechanism and interface 940 is configured to activate one sensor at a time in a round-robin fashion. In alternative embodiments of the present invention, a subset or a limited number of the sensors are activated at the same time, as defined by the timing mechanism.

In an embodiment, delay information can be used as an additional input for switch monitoring if the current path has a different delay characteristic in case of the open and the closed switch, for example, in cases where signal paths via the supply source or the connected load include long lines or coils. Alternatively, I/Q demodulation can be used to get additional information about the absolute value and the phase relation of the incoming current and the transmitted sequence. The I/Q demodulation replaces the adaptation of the delay time for the demodulation.

Advantages of some embodiments of the present invention include detection of a switching state independent from the voltage level at the switch contacts. Certain embodiment sensors, therefore, are operable with switches at any voltage potential in a system. Furthermore, some embodiments of the present invention optionally offer galvanic isolation of the detection circuit from the power circuit for the case where the power side of a system and the control side are not referenced to the same ground potential. In some advantageous embodiments, the switch sensor is not sensitive to voltage levels at the power contacts of the switch, for example, in the case of high static voltage and fast transients. In some embodiments, advantages of capacitive coupling between the sensor and contacts of the switch being evaluated are related to the voltage across an open switch, in that a small coupling capacitance limits the voltage over the sensor, even if the switch works with high voltages.

Another advantage of some embodiments is that each switch or fuse in a multi-switch system can be analyzed independently from other switches and fuses in the system.

In some advantageous embodiments, the switch detection mechanism is operable both with and without current flowing through the switch or fuse. Furthermore, in embodiments where there is no parasitic current path from the switch sensor, the sensor can remain operable under load conditions or overload conditions. Furthermore, embodiment sensors can be operated while the system is running, as well as when portions of the system are powered down, or even disconnected from the power supply. In some advantageous embodiments, no significant current is induced in the power switch by the diagnostic means.

In some embodiments, where there is slow switching capability of relays or fuses, the switch sensor can also operate slowly.

Another advantage of some embodiments is low production costs. For example, costs are saved in embodiments that do not require trimming. Furthermore, lower bill of material costs are achieved, for example, in embodiments that do not use high voltage components within the switch sensor, because inexpensive, low voltage semiconductor processes can be used to fabricate the sensors.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A device comprising:
a circuit with at least one circuit element;
measurement circuitry capable to test a state of the at least one circuit element during an operation of the circuit, the measurement circuitry comprising
a first terminal configured to be coupled to a first node of the circuit via a first capacitor;
a second terminal configured to be coupled to a second node of the circuit;
wherein the measurement circuitry is configured to determine an operating state of the at least one circuit element based on signals applied by the measurement circuitry to the circuit during a normal operation of the circuit.

2. The device of claim 1, wherein the measurement circuitry comprises at least one transmitter coupled to the first terminal and at least one receiver coupled to the second terminal.

3. The device of claim 1, wherein:
the at least one circuit element comprises a switch;
wherein the measurement circuitry is configured to determine whether the switch is closed or open.

4. The device according to claim 3, wherein the measurement circuitry further determines that the first circuit is in a first state if a ratio of a first transmission factor to a second transmission factor is above a first threshold; and
the measurement circuitry further determines that the first circuit is in a second state if the ratio of the first transmission factor to the second transmission factor is below the first threshold.

5. A system for in-situ testing of at least one circuit element, the system comprising a sensor, the sensor comprising
a first terminal configured to be coupled to a first node of the at least one circuit element;
a second terminal configured to be coupled a second node of the at least one circuit element
a third terminal configured to be coupled to the second node of the at least one circuit element; and
at least one transmitter and at least one receiver configured to provide a measurement of a first transmission factor between the first terminal and the second terminal, the at least one transmitter and the at least one receiver further configured to provide a measurement of a second transmission factor between the third terminal and the second terminal, wherein
the sensor determines an operating state of the at least one circuit element based on a ratio of the first transmission factor to the second transmission factor.

6. The system of claim 5, further comprising:
at least one first capacitor coupled between the first terminal of the sensor and the first node of the at least one circuit element; and
at least one second capacitor coupled between the third terminal of the sensor and the second node of the at least one circuit element.

7. A method for in-situ testing at least one circuit element, the method comprising:
measuring a first AC transmission factor through a first signal path, the first signal path comprising a first series capacitor and a first terminal and a second terminal of the at least one circuit element;

measuring a second AC transmission factor though a second signal path, the second signal path comprising the first terminal of the at least one circuit element and a second series capacitor; and determining an operating state of the at least one circuit element during normal operation based on the first AC transmission factor and the second AC transmission factor.

8. The method of claim 7, wherein the determining of an operating state of the at least one circuit element comprises determining whether a ratio of the first AC transmission factor to the second AC transmission factor exceeds a threshold.

9. The method of claim 8, further comprising determining the threshold based on: measuring a first ratio of the first AC transmission to the second AC transmission when the at least one circuit element is in a first state;

measuring a second ratio of the first AC transmission to the second AC transmission when the at least one switch is in a second operation state; and determining the threshold based on the first ratio and the second ratio.

\* \* \* \* \*